(12) United States Patent
Wilson (10) Patent No.: US 9,385,605 B2
(45) Date of Patent: Jul. 5, 2016

(54) SWITCHED MODE POWER SUPPLY WITH A BYPASS PATH FOR SHUNTING CURRENT

(75) Inventor: Martin Paul Wilson, Cambourne (GB)

(73) Assignee: SNAPTRACK, INC., San Diego, CA (US)

( * ) Notice: Subject to any disclaimer, the term of this patent is extended or adjusted under 35 U.S.C. 154(b) by 665 days.

(21) Appl. No.: 13/699,872

(22) PCT Filed: May 24, 2011

(86) PCT No.: PCT/EP2011/058493
§ 371 (c)(1),
(2), (4) Date: Apr. 12, 2013

(87) PCT Pub. No.: WO2011/147841
PCT Pub. Date: Dec. 1, 2011

(65) Prior Publication Data
US 2013/0193943 A1     Aug. 1, 2013

(30) Foreign Application Priority Data
May 24, 2010 (GB) .................................. 1008636.1

(51) Int. Cl.
H02M 3/158 (2006.01)
H03F 1/02 (2006.01)
G05F 1/56 (2006.01)

(52) U.S. Cl.
CPC .......... *H02M 3/1582* (2013.01); *H02M 3/1584* (2013.01); *H03F 1/0227* (2013.01); *G05F 1/56* (2013.01); *H03F 2200/78* (2013.01)

(58) Field of Classification Search
CPC ..... G05F 1/56; H02M 3/1584; H02M 3/1582; H02M 3/158; H03F 1/0227; H03F 2200/78
USPC ......... 323/222, 225, 259, 268, 271, 272, 282, 323/284, 285
See application file for complete search history.

(56) References Cited

U.S. PATENT DOCUMENTS

2003/0218894 A1   11/2003   Utsunomiya
2005/0184712 A1   8/2005   Wei et al.
(Continued)

FOREIGN PATENT DOCUMENTS

EP     0949739 A2   10/1999
EP     1703626 A2    9/2006
(Continued)

OTHER PUBLICATIONS

Agnes Wittmann-Regis, "International Patent Application No. PCT/EP2011/058493 International Preliminary Report on Patentability", Dec. 6, 2012, Publisher: PCT, Published in: EP.
(Continued)

*Primary Examiner* — Fred E Finch, III
*Assistant Examiner* — Gustavo Rosario Benitez (57) ABSTRACT

A switching stage is provided that generally includes multiple switching paths for routing a signal. For example, the switching stage may include a first switching path having at least one switching element for selectively connecting an input of the switching stage to an output of the switching stage and a second switching path having at least one switching element for selectively connecting the input of the switching stage to the output of the switching staged. In certain aspects, the first and second switching paths are controlled such that a signal is selectively routed from the input of the switching stage to the output of the switching stage via the first and second switching paths in dependence on the current of the signal to be routed.

17 Claims, 6 Drawing Sheets

(56) References Cited

U.S. PATENT DOCUMENTS

| | | | |
|---|---|---|---|
| 2005/0212497 A1 | 9/2005 | Cha | |
| 2007/0096703 A1* | 5/2007 | Jain | 323/282 |
| 2007/0103136 A1* | 5/2007 | Jain | G06F 1/26 323/282 |
| 2007/0120548 A1* | 5/2007 | Kojima | H02M 3/1588 323/284 |
| 2008/0307242 A1* | 12/2008 | Qu | H02J 9/005 713/320 |
| 2009/0167080 A1* | 7/2009 | Carpenter | H02M 3/1584 307/14 |
| 2009/0262555 A1* | 10/2009 | Asuke | H02M 3/1584 363/16 |
| 2010/0007316 A1* | 1/2010 | Miller et al. | 323/282 |
| 2010/0045110 A1* | 2/2010 | Liu | H02M 3/158 307/32 |
| 2010/0301826 A1 | 12/2010 | Moussaoui et al. | |
| 2011/0187336 A1* | 8/2011 | Wu et al. | 323/282 |

FOREIGN PATENT DOCUMENTS

| | | |
|---|---|---|
| GB | 2460072 A | 11/2009 |
| WO | 03021766 A2 | 3/2003 |
| WO | 2005022737 A1 | 3/2005 |
| WO | 2006080260 A1 | 8/2006 |

OTHER PUBLICATIONS

International Search Report, dated Nov. 19, 2012 of International Application No. PCT/EP2011/058493, filed: May 24, 2011.
European Search Report, dated Sep. 30, 2012 of Great Britain Application No. 1008636.1.

* cited by examiner

FIG. 8

SWITCHED MODE POWER SUPPLY WITH A BYPASS PATH FOR SHUNTING CURRENT

BACKGROUND TO THE INVENTION

1. Field of the Invention

The invention is related to an improved switching arrangement. The invention is particularly but not exclusively directed to an efficient method and apparatus for providing multiple supply voltages from a single voltage source for a switched-mode voltage supply.

2. Description of the Related Art

Envelope tracking is a well-known technique for improving the efficiency of RF (radio frequency) power amplifiers that handle a non-constant envelope signal. In order to implement envelope tracking techniques there is a need for efficient power modulators that can follow a rapidly changing signal. A problem is to provide an accurate fit to a rapidly changing signal whilst retaining the efficiency of a switched converter.

It is well-know to those skilled in the art that a much closer fit to a switched signal can be achieved by switching between a multiple level signal than can be achieved between a single level and ground. This can be understood with reference to FIGS. 1(a) and 1(b).

Figure 1A:
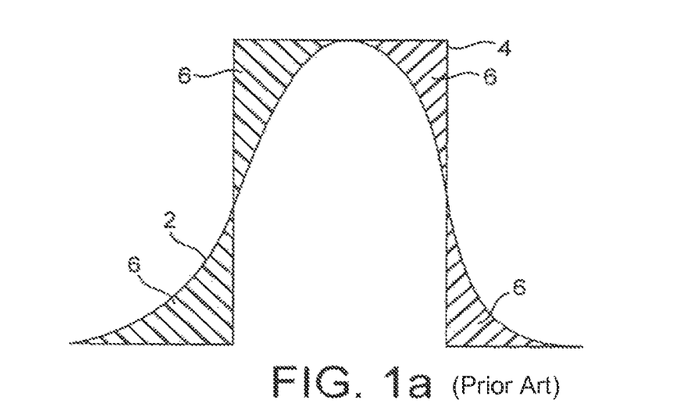
FIGS. 1a and 1b illustrate the principle of using voltage levels to replicate a time-changing signal in the prior art.
Figure 1B:
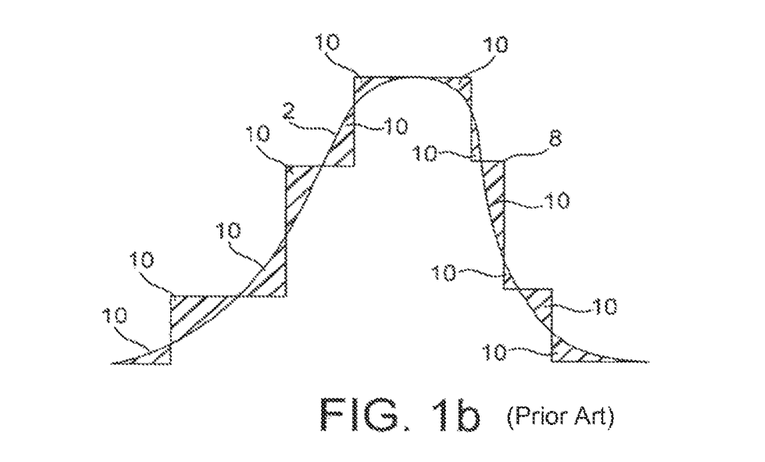

In FIG. 1(a) the desired output signal waveform 2 is approximated by a single switched level signal 4. This results in errors as denoted by the shaded areas 6. In FIG. 1(b) a multiple (in this example three) level switching element is provided, such that the switched level signal can be switched between more than one level in addition to ground. As seen in FIG. 1(b), the multiple switched level signal 8 more closely approximates the desired output signal waveform 2, such that the errors as denoted by shaded areas 10 are much smaller.

Figure 2:
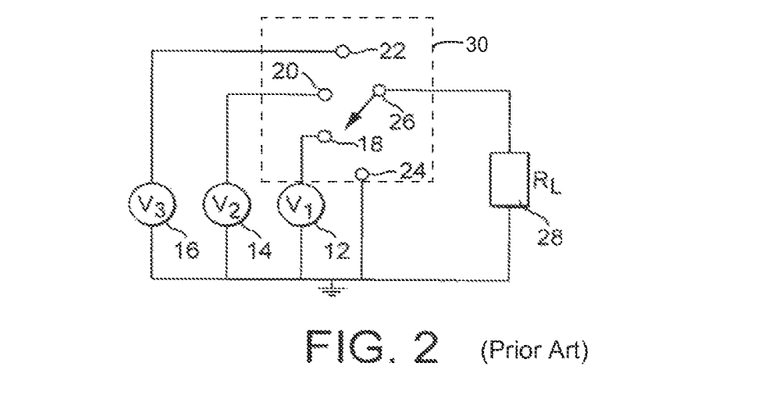
FIG. 2 illustrates a multiple level voltage stage in the prior art.

A simple example of an arrangement for providing a multiple switched level signal is shown in FIG. 2. A plurality of voltage sources 12, 14, 16, having nominal values V1, V2, and V3 respectively, are connected between electrical ground and distinct terminals 18, 20 and 22 of a multi-pole switch 30. An additional terminal 24 of the switch is also connected directly to electrical ground. The switch is controlled to connect one of the voltage sources, or electrical ground, to a further switch terminal 26, which is connected to one terminal of a load 28, having another terminal connected to electrical ground. In this way one of four voltage supply levels (or ground) is provided to the load, to provide an output signal as illustrated in FIG. 1(b).

However, in certain implementations, such as in portable equipment, only one voltage source is provided from a single battery. Therefore to achieve a multiple switched level signal, a suitable converter has to be provided to convert the battery voltage to the desired multiple voltage levels. This is achieved, as known in the art, by using a buck-boost converter. A particularly advantageous arrangement of a buck-boost converter is disclosed in United Kingdom Patent Application Publication No. 2460072, in the name of Nujira Limited.

Figure 3:
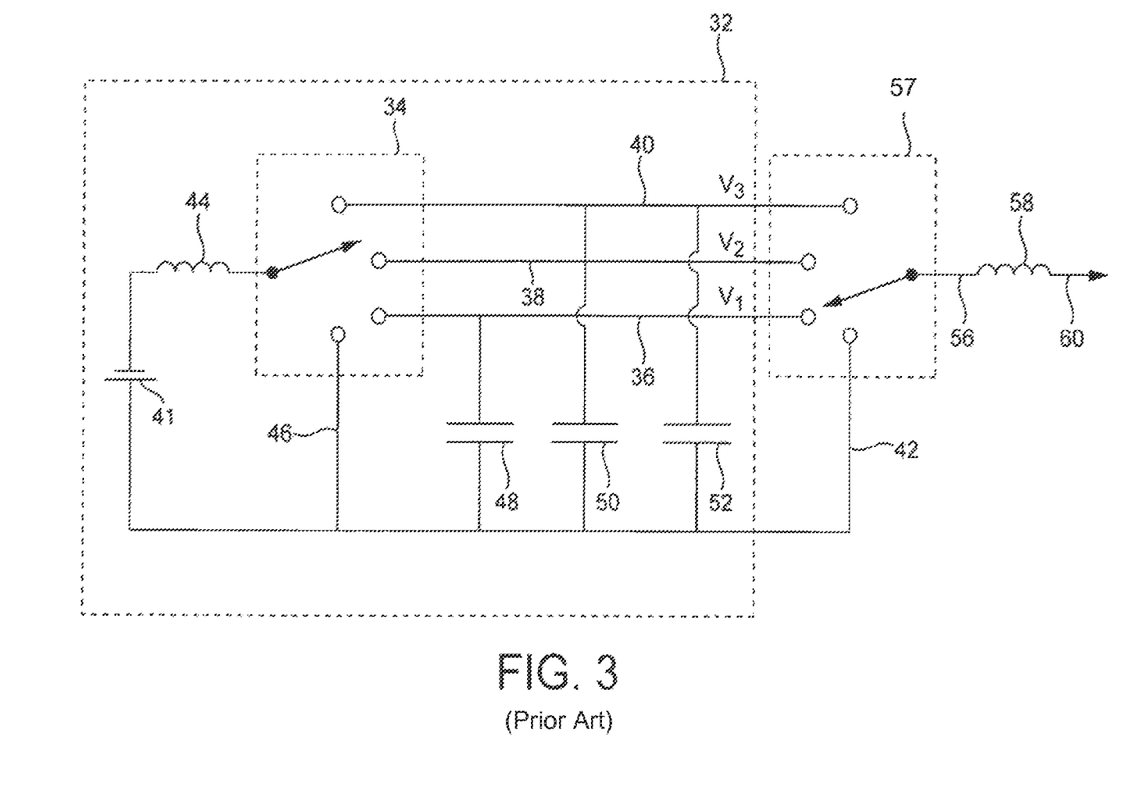
FIG. 3 illustrates a boost converter in the prior art.

FIG. 3 illustrates the simplified boost (not buck) principle of an advantageous voltage converter as disclosed in United Kingdom Patent Application Publication No. 2460072. The voltage converter is generally designated by reference numeral 32, and includes a switch 34. Additionally illustrated is a further modulator switch 57, which comprises a voltage modulator for selecting a currently desired power supply level.

The converter 32 of FIG. 3 provides three different power supply voltages V1, V2, V3 on lines 36, 38, 40 from a single voltage source provided by a battery 41. In addition an electrical ground signal level is provided on line 42. An inductor 44 is connected between one terminal of the battery 41 and a terminal of the switch 34. The switch 34 is controlled to selectively connect the inductor to any one of lines 36, 38, 40, or to ground on line 46. A plurality of capacitors, corresponding to the number of voltage signals being generated, is provided, each connected between an output signal line from the switch 34 and ground. Thus there is provided capacitors 48, 50, and 52, respectively connected between the lines 36, 38 and 40 and electrical ground. The switch 34 switches the output of the inductor 44 to the lines 36, 38 and 40, and hence the capacitors 48, 50, and 52, in such a way that the voltages V1, V2, and V3 are formed on the lines 36, 38, and 40. The modulator switch 57 then switches a selected one of the voltages V1, V2, V3 to an output, by selecting one of the lines 36, 38, 40, and 42 to be connected to an output line 56 and connected to a further inductor 58, the other terminal of the inductor 58 providing the modulator output on line 60. The switch 34 typically switches at a lower rate than the switch 57, because charge is stored in the capacitors.

With the arrangement of FIG. 3, effectively two voltage converters are connected in cascade. In addition, each switch (in the switch bank 34 and the switch bank 57) has a resistive loss associated with it that is inversely proportional to its size. Since current is always flowing through one switch in each of the switch banks 34 and 36 at any instant in time, the effect of the switch banks is as if the current flows permanently through a fixed resistor in each of the switch banks.

Because of the cascading of the switch banks, and because there is half the number of switch transistors in a buck converter in the front end, then for an equivalent unit resistance the transistors and their associated metal interconnects have to occupy a much larger area. When the routing is applied on an IC (integrated circuit), this becomes a serious problem because of the relatively high resistance of the thin metal. The critical interconnect is illustrated in FIG. 3 by the drawing of thick lines.

It is thus an aim of the invention to provide an improved arrangement for a wideband switched mode power supply based upon a switching between multiple voltage levels.

SUMMARY OF THE INVENTION

The invention provides a switching stage comprising: a first switching path having at least one switching element for selectively connecting an input of the switching stage to an output of the switching stage; and a second switching path having at least one switching element for selectively connecting the input of the switching stage to the output of the switching stage, wherein the first and second switching paths are controlled such that a signal is selectively routed from the input of the switching stage to the output of the switching stage via the first and second switching paths in dependence on the current of the signal to be routed.

The first and second switching paths may each include an inductive element. At least one switching element of the first switching path may be configured to handle a smaller current than the at least one switching element of the second switching path. The size of the at least one switching element of the first switching path may be smaller than the size of the at least one switching element of the second switching path.

The at least one switching element of the second switching path may be selectively connected to route current from the input to the output such that the current in the second path is maintained within a predetermined range. The at least one switching element of the second switching path may be selectively connected to route current from the input to the output such that the current in the second path is maintained within a predetermined range to maintain a longer term average of current in the first switching path at a fixed level. The at least one switching element of the second switching path may be selectively connected to route current from the input to the output such that with the at least one switching element in a first state, the current in the second path rises until a first threshold level is reached, responsive to which condition the at least one switching element is switched to a second state, wherein in the second state the current in the second path falls until a second threshold level is reached, responsive to which condition the at least one switching element is switched to the first state.

The first threshold level may be above a predetermined level by a fixed amount, and the second threshold level is below the predetermined level by the fixed amount.

There may be provided a further switching element in the second switching path arranged to selectively connect the first terminal of the inductor to a higher voltage level, wherein the connection to the higher voltage level is enabled responsive to the current in the second path falling to the second threshold level when the at least one switching element is in the first state. The higher voltage level may be provided by a signal line of the first switching path.

The further switching element may connect the first terminal of the inductor to the higher voltage until the current in the second switching path rises to the first threshold level.

The further switching element may be arranged to switch the first terminal of the inductor to successively higher voltages if the current falls to the first predetermined threshold level whilst connected to a given voltage level.

The further switching element may be arranged to switch the first terminal of the inductor to successively lower voltages if the current rises to the seconds predetermined threshold level whilst connected to a given voltage level.

The at least one switching element of the second switching path may comprise a switch connected between a voltage source and a first terminal of an inductor, a second terminal of the inductor being connected to the out of the switching stage, wherein in a first state the switch connects the first terminal of the inductor to the voltage source, and in a second state the switch connects the first terminal of the inductor to electrical ground.

The first state of the switch may correspond to the first state of the switching element, and the second state of the switch corresponds to the second state of the switching element.

The predetermined range may include an upper and a lower limit determined in dependence on an average value of the current in the main path.

The predetermined range may be defined by the long term average of the current in the main path adjusted by an error range.

The input of the switching stage may be connected to a voltage source. The output of the switching stage may be connected to provide a supply voltage.

The at least one switching element of the first switching path may include at least one switch array for connecting the input to one a plurality of outputs.

The at least one switching element of the first switching path may include at least one switch array for connecting one of a plurality of inputs to an output.

The at least one switching element of the first switching path may include a first switch array for connecting an input to one of a plurality of intermediate signals lines, and a second switch array for connecting one of the plurality of intermediate signal lines to the output.

The switching stage may further comprise an inductor connected between a voltage source and the input of the first switch array. The switching stage may further comprise an inductor connected between the output of the second switching path and the output of the switching stage. The switching stage may further comprise a plurality of capacitors, each capacitor being connected between a respective intermediate signal line and electrical ground. The switching stage may further comprise a capacitor connected between the output of the switching stage and electrical ground. The switching stage may further comprise an inductor connected between the output of the first switching path and the output of the first switching stage.

The invention further provides a voltage converter including a switching stage comprising: a first switching path having at least one switching element for selectively connecting an input of the switching stage to an output of the switching stage; and a second switching path having at least one switching element for selectively connecting the input of the switching stage to the output of the switching stage, wherein the first and second switching paths are controlled such that a signal is selectively routed from the input of the switching stage to the output of the switching stage via the first and second switching paths in dependence on the current of the signal to be routed, wherein the at least one switching element of the first switching path comprises a first switch array controlled to generate a plurality of voltage supply levels on the intermediate signal lines, and the at least one switching element of the first switching path comprises a second switch array controlled to select one of the generated voltage supply levels as a voltage supply.

The second switch array is controlled to track the envelope of a reference signal, such that an output voltage is developed at the output of the switching stage which corresponds to a desired voltage level.

BRIEF DESCRIPTION OF THE DRAWINGS

The invention will now be described with reference to the accompanying drawings in which.

DESCRIPTION OF THE PREFERRED EMBODIMENTS

The present invention is now described by way of example with reference to exemplary embodiments. One skilled in the art will appreciate that embodiments are described for ease of understanding the invention, and the invention is not limited to details of any embodiment described. The scope of the invention is defined by the appended claims.

In the following description where the same reference numerals are used in different Figures, they denote an element in one Figure which corresponds to an element in another Figure.

Figure 4:
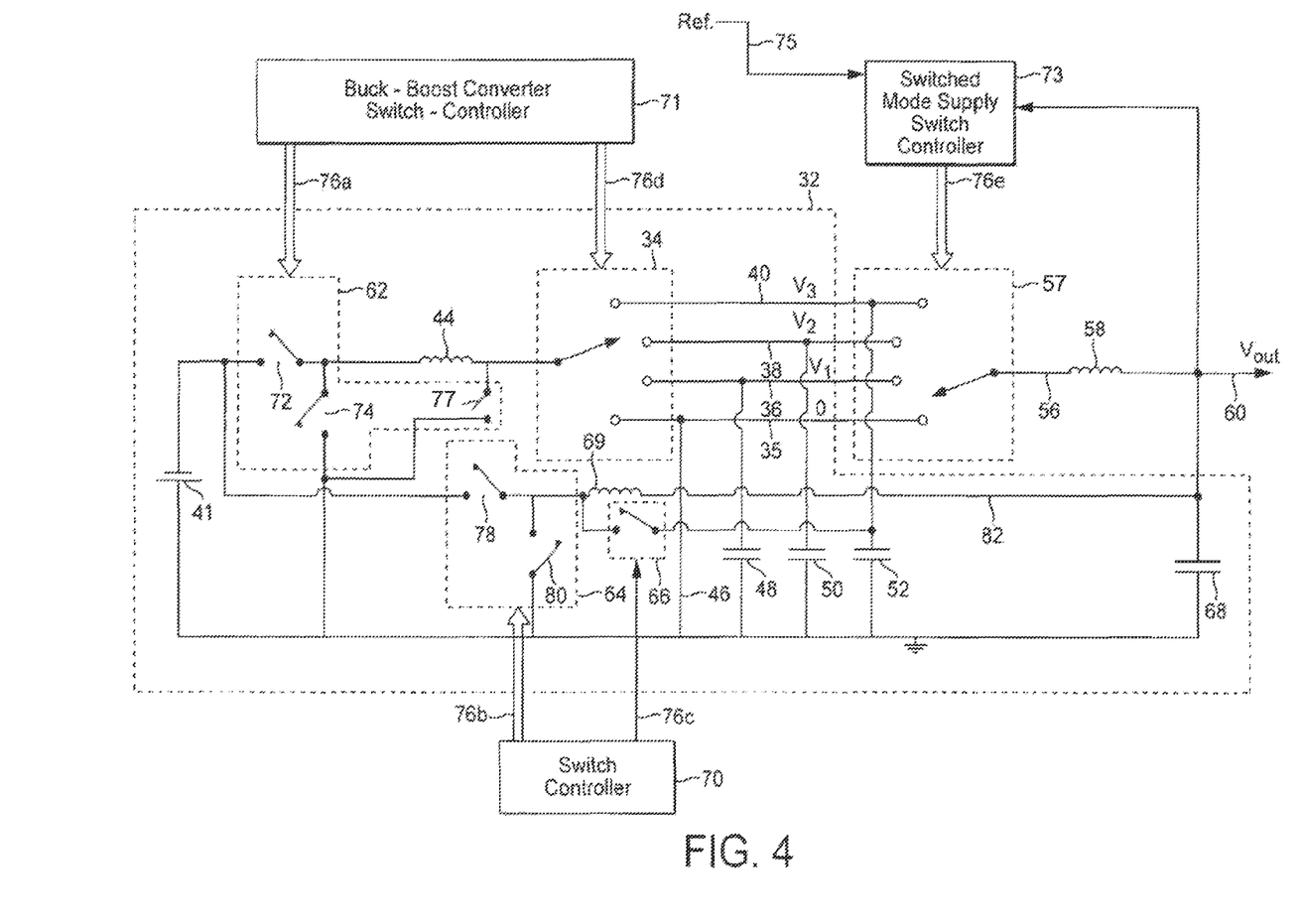
FIG. 4 illustrates an improved buck-boost converter in accordance with an embodiment of the invention.

With reference to FIG. 4, there is illustrated a voltage supply stage in accordance with an embodiment of the invention.

The converter 32 of FIG. 3 is adapted to include additional switch stages 62 and 64. It should be noted that the switch stage 62 in fact provides buck control of the arrangement shown in FIG. 3, and therefore in the preferred embodiment the adaptation of the arrangement of FIG. 3 to facilitate embodiments of the invention requires the addition of the switch stage 64.

Further in accordance with the invention and its embodiments, the converter 32 includes an additional capacitor 68, an additional inductor 69, and optionally an additional switch stage 66.

A switch controller 70 provides switch control signals 76b and 76c to the switch stages 64 and 66 in accordance with embodiments of the invention, as will be discussed further hereinbelow.

A switch controller 71 provides switch control signals 76a and 76d to the switch stages 62 and 34 respectively, to operate the buck and boost operation of the voltage converter 32 in accordance with prior art techniques.

A switch controller 73 provides switch control signals 76e to the switch stage 57. The switch controller receives a reference voltage signal on line 75 as one input, and the output voltage signal voltage on line 60 as another input. The switch stage 57 is a modulator switch, for providing selection of the selected supply voltage for a switched-mode power supply in accordance with a preferred embodiment. The switch controller 73 contains a suitable high speed control loop (as known in the art) that controls switch bank 57 in such a manner that the output voltage on line 60 closely follows the reference voltage input on line 75. The input on line 75 may be an envelope signal for an envelope tracking power supply, for example. Thus, as known in the art, the switched mode power supply controller 73 selects one of the voltages on lines 35 to 40 to maintain the appropriate voltage level $V_{out}$ on line 60.

For the specific buck-boost converter arrangement illustrated in FIG. 4, as disclosed in United Kingdom Patent Application Publication No. 2460072, there is an example control technique for the switches 62 and 34 in buck-boost operation described therein.

It should be noted that the buck-boost converter 32 of FIG. 4 utilises an advantageous structure as disclosed in United Kingdom Patent Application Publication No. 2460072, in which multiple voltage levels are generated using multiple capacitors with a single inductor. This invention, and its embodiments, are not however limited in their applicability to such an arrangement. The invention and its embodiments applies to any arrangement in which a switching stage is used to switch a single voltage source to multiple signal lines, to generate multiple voltage supply levels. Additional circuitry, other than that shown in FIG. 4, may be required to fully implement a buck-boost converter in accordance with the prior art.

The operation of the buck-boost converter illustrated in FIG. 4, utilising the switching stages 62 and 34, the inductor 44, and the capacitors 48 to 52, is not described in detail herein, and falls outside the scope of the present invention: as noted above, this invention is not limited to any specific buck-boost converter arrangement. One skilled in the art will understand the general operation of such a buck-boost converter. However, in general, in a buck mode of operation the switch 77 continuously open. The switches 72 and 74 are controlled in combination with the switching of the array 34. In boost mode, switch 72 is continuously closed, and switch 74 is continuously open.

The invention is thus described, as set out above and in FIG. 4, in the context of its application in an embodiment to a switched mode power supply including a switching stage of a buck-boost converter and a switching stage of a modulated supply.

In accordance with the invention and its embodiments, an additional path, which may be referred to as a bypass path, is provided around the switched mode power supply. This additional path is provided to shunt current, particularly large current, around the switched mode power supply. As large current is, as will be discussed further hereinbelow, predominantly associated with low frequency signals, then low frequency signals are preferably shunted around the buck-boost converter and the modulated supply of the switched-mode power supply, directly to the output.

Being of a low frequency in nature, these signals do not benefit from application to the multiple level switching circuitry of the buck-boost converter, and therefore no reduction in performance is achieved by this shunting.

Figure 5:
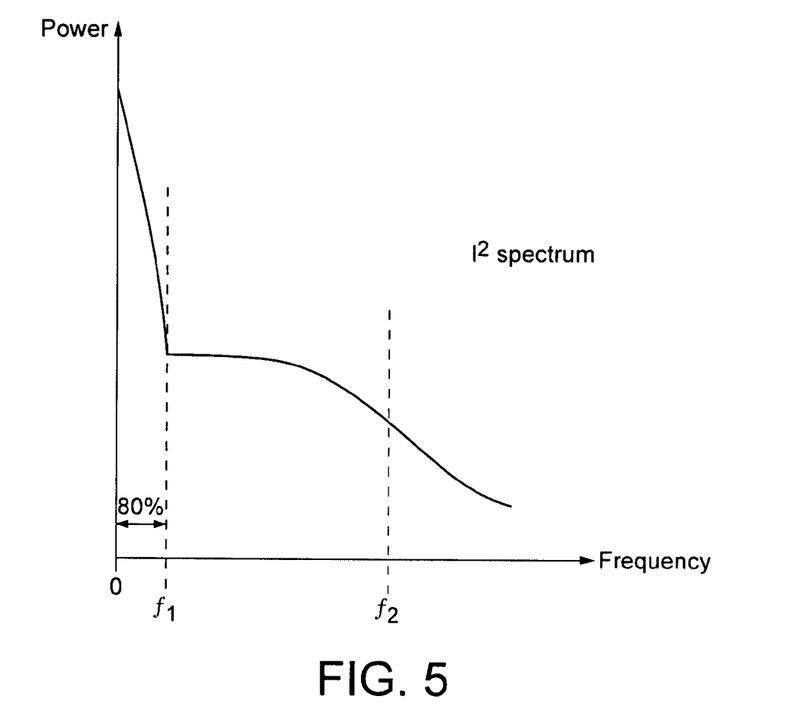
FIG. 5 illustrates an advantage of the invention.
Figure 6:
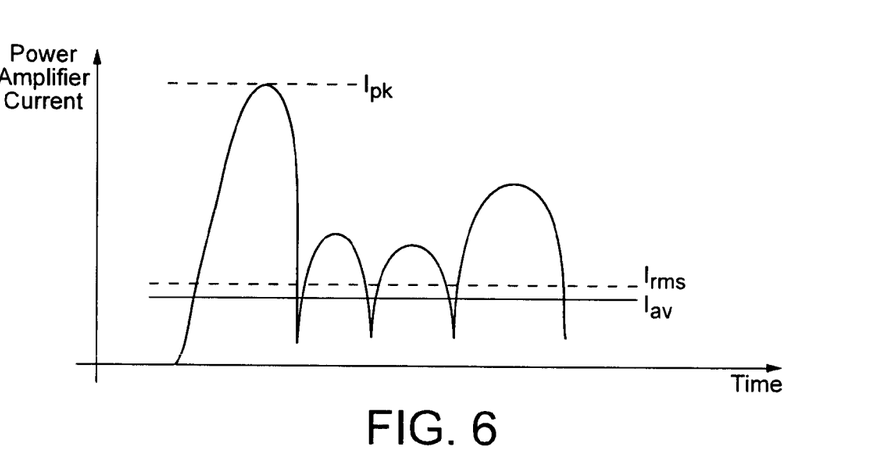
FIG. 6 illustrates an advantage of the invention.

The advantages achieved by the invention can be understood with reference to FIGS. 5 and 6.

FIG. 5 shows the spectral distribution of the current drawn by the output stage of a non-constant envelope RF system. FIG. 6 illustrates the characteristics of the power amplifier current over time.

Most of the power, of the order of 80% of the power, represented by this current is present at DC. This corresponds to the average current Iav shown in FIG. 6. The total power is represented in FIG. 6 by the root-mean-square current Irms, which is slightly above the average current Iav. The difference between the root-mean-square current and the average current is the power of the AC part of the waveform, which is provided by the multiple level switching stages. The remainder of the power which the arrangement of FIG. 3 must handle is DC power. By adapting the prior art such that the multiple level switching stages are not required to handle the DC power, then the multiple level switching stage is required to handle a much smaller power, and then these sections and their interconnect can be made much smaller.

Thus by selectively shunting current around the switched mode power supply, the transistors of the multiple level switching stages can be made smaller, as well as interconnects associated with the multiple level switching stages being made smaller.

The operation of the embodiment, in accordance with the invention is now described further.

Reverting to FIG. 4, the battery 41 is connected to a first terminal of the inductor 44 through a switching stage 62. The switching stage 62 includes a switch 72 having a closed state in which the battery is connected to the inductor 44, and an open state in which the battery is disconnected from the inductor 44. The switching stage 62 includes a switch 74 having a closed state in which the inductor is connected to electrical ground, and an open state in which the inductor is disconnected from electrical ground. The switching stage 62 further includes a switch 77 connected between a second terminal of the inductor 44 and electrical ground.

The battery 41 is further connected to the inductor 69 through a switching stage 64. The switching stage 64 includes a switch 78 having a closed state in which the battery is connected to a first terminal of the inductor 69, and an open state in which the battery is disconnected from the inductor 69. The switching stage 64 includes a switch 80 having a closed state in which the first terminal of the inductor 69 is connected to electrical ground, and an open state in which the inductor 69 is disconnected from electrical ground.

A second terminal of the inductor 69 is connected to a signal line 82, which is connected to the output line 60 of the switched mode power supply. The capacitor 68 is connected between the signal line 82 (and hence the output line 60) and ground. A voltage is formed across the capacitor 68 in the same way that voltages are formed across the capacitors 48 to 52, but utilising the inductor 69 rather than the inductor 44.

Switches 78 and 80 of the switching stage 64 are required to switch at low frequencies only, as they are provided to switch large currents which occur at low frequencies. Thus the size of the switches 78 and 80 (i.e. the size of the transistors implementing the switches) can be increased without penalising efficiencies.

The switch controller 70 may modify the duty cycles of the switches 78 and 80 so that the average current through the multiple level supply stage (formed of switching stages 34 and 57) is maintained close to zero. This will occur when the average output voltage of the switching stage 64 is equal to the average output voltage on line 60. However, imposing this condition would mean that the maximum average output voltage on line 60 cannot exceed the battery voltage.

In order to address this, a further optional modification is provided by the inclusion of the switch 66. As illustrated in FIG. 4 the switch 66 is connected at a node between the switch 78 and the inductor 69, and further connected to the highest multiple level intermediate voltage on line 40.

The provision of the switch 66 removes the restriction that the maximum average voltage output cannot exceed the battery voltage. This allows the circuit to continue operating. However some efficiency reduction occurs close to the battery end point.

With the modification of FIG. 4, incorporating the bypass path provided by the switch stage 64, the critical interconnects which are required to be thick—to carry large currents—are primarily external to the IC. These interconnects are illustrated by the thick lines of FIG. 4.

A mechanism to control the switch stage 64 must be provided. It will be understood that the switch stages 62 and 34 will be controlled in accordance with the requirements to achieve the setting of the appropriate voltage levels on the lines 36, 38, 40, for the buck converter, which falls outside the scope of the present invention. It will also be understood that the switch stage 57 will be controlled in accordance with the requirement, by a supply voltage modulator, to select the determined appropriate switch supply, which again falls outside the scope of the present invention.

A complication arises in that the variable which is being controlled is also being controlled by the switch controller 71 of the buck-boost converter. However the multi-level supply switch controller 71 is configured to respond rapidly, whereas the switch controller 70, which can be considered a DC feed controller, responds very slowly. This separation of response times enables stable control. The operation of the switch controller 70 is therefore preferably implemented independently of the operation of the switch controller 71.

Figure 7:
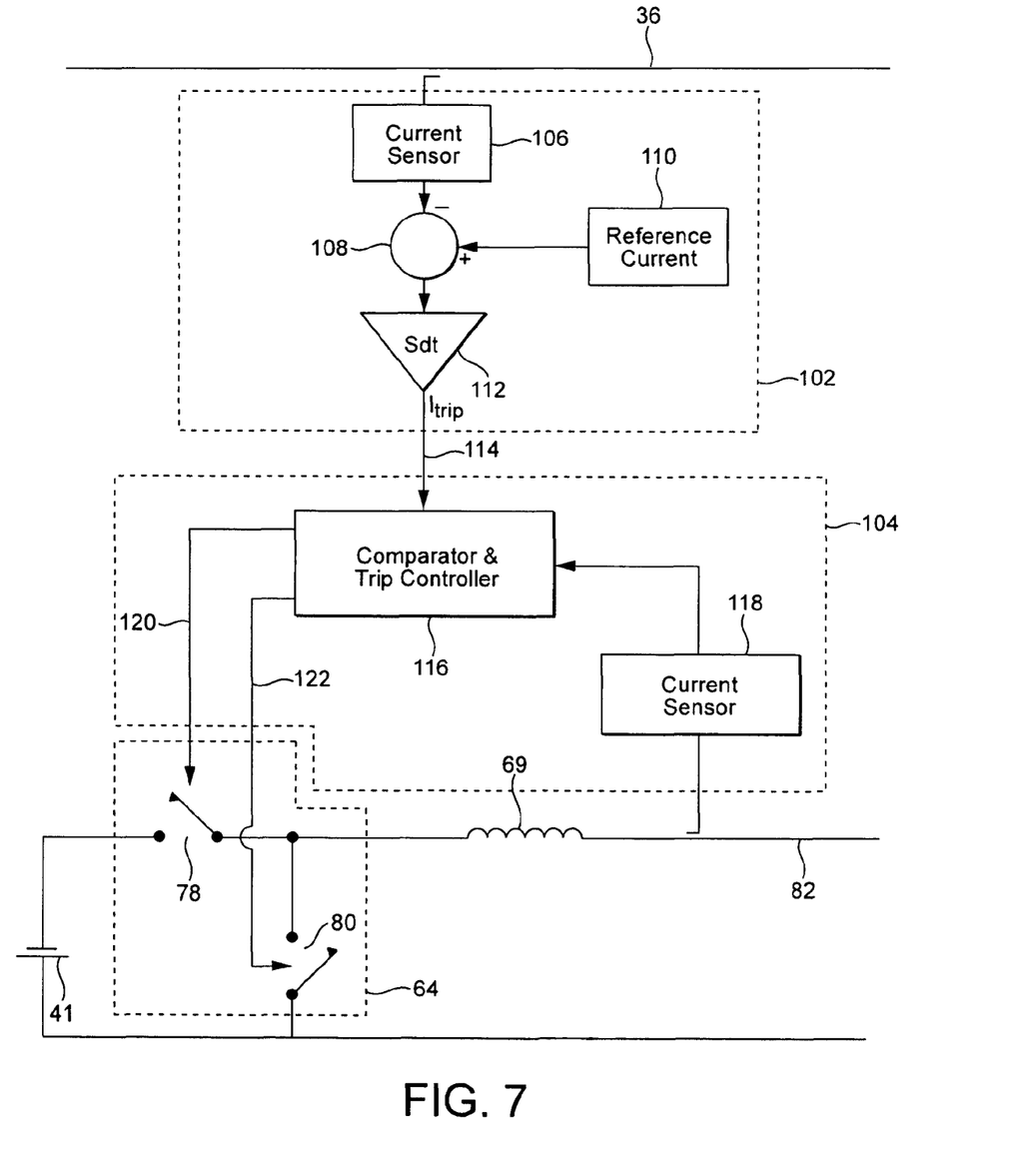
FIG. 7 illustrates a controller for the improved buck-boost converter of FIG. 4.

With reference to FIG. 7, there is illustrated an exemplary implementation of the switch controller 70, for generating the switch control signals 76b to the switch stage 64.

The switch controller 70 generally includes a first controller 104 and a second controller 102. The first controller 104 generates the control signals for the switches 78 and 80 of the switch stage 64. The second controller 102 generates a reference signal for triggering the controller 104. The controllers 102 and 104 are now described in further detail.

The controller 104 is a Hysteretic current mode controller, which is known to those of skill in the art. The controller 104 includes a current sensor 118 and a comparator and trip controller 116. The current sensor 118 is arranged to sense the current on line 82, and provide the sense current as an input to the comparator and trip controller 116. The comparator and trip controller 116 additionally receives a trip current value, $I_{trip}$ on an input line 114, from the further controller 102. The comparator and trip controller 116 generates two switch control signals 120 and 122, which respectively control the switches 78 and 80. The comparator and trip controller 116 operates to close the switch 78 and open the switch 80 when the sensed current on line 82 drops below the trip level $I_{trip}$. When the sense current on line 82 rises above a current level $(I_{trip}+I_{hyst})$ then switch 78 is opened and switch 80 is closed. With this simple control means, the current is then bounded between limits and the circuit arrangements in effect becomes a highly efficient controllable current source means.

Figure 8:
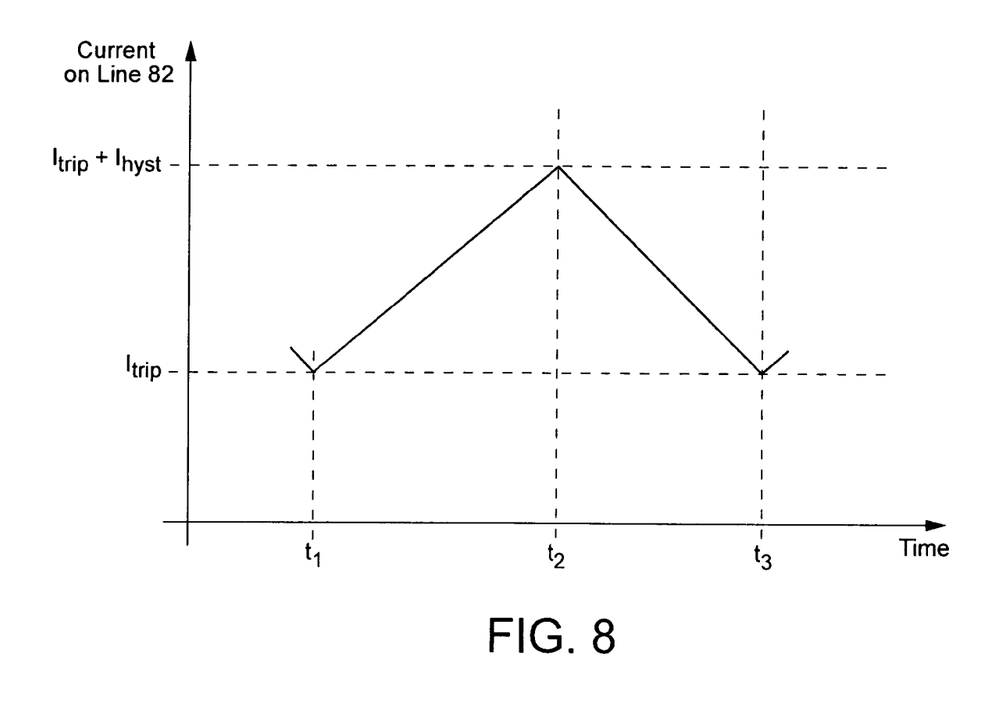
FIG. 8 illustrates the operation of the controller of FIG. 7.

This operation is further illustrated with respect to FIG. 8. FIG. 8 shows a plot of the current on line 82 over time. As shown in FIG. 8, there are two threshold levels of current marked, the first being the $I_{trip}$ level and the second being the $(I_{trip}+I_{hyst})$ level. As can be seen, at a time $t_1$ the current rises. At a time $t_2$ the current achieves the value $(I_{trip}+I_{hyst})$, and as a result of the controlling of the switches 78 and 80 by the comparator and trip controller 116, the current then begins to fall. At a time $t_3$ the current falls to a level $I_{trip}$, and the switches 78 and 80 are then controlled by the comparator and trip controller 116 such that the current thereafter rises.

The controller 102 is illustrated as providing the trip currents $I_{trip}$ on line 114. As illustrated in FIG. 7, the controller 102 includes a current sensor 106, a reference current generator 110, a combiner 108, and an integrator 112.

The current sensor 106 senses the current on the line 36, being the supply voltage line connected to electrical ground. The sense current is provided as a first input to the combiner 108, the second input of which is derived from the reference current generator 110. The reference current generator 110 generates a current value which represents the desired current value on line 36. Thus the output of the combiner 108 generates an error signal, representing an error in the current on the line 36 in comparison to the desired current value for that line. The error output of the combiner 108 provides an input to the integrator 112, so as to steer the integrator 112. The output of the integrator 112 generates the trip current $I_{trip}$ on line 114.

The provision of the controller 102 arranged to generate the trip current signal based on the current on line 36, closes a loop around the buck mode current source provided by the controller 104.

The output voltage $V_{out}$ on line 60 is determined by a high speed controller that adjusts the switching level and duty cycle of switch 57 so that a wanted high speed signal is reproduced with high fidelity on line 60. An example of such means is described in United Kingdom patent application publication No. 2459894.

The invention, as discussed above, permits the size of the switching devices (i.e. transistors) in switch stages 72 and 74 to be reduced. By reducing the size of the devices in switch stage 57, it is possible to increase the speed of operation and consequently the fidelity of the reproduced voltage signal on line 60. It can be seen from the controller description above of the injected current through the buck inductor 69 that there is a slow ramp in the current. The effect of this ramp is removed by the fast control loop 73 in FIG. 4, that forces the output voltage on line 60 to closely follow the reference voltage signal 75.

In general, the invention is applicable to any switching arrangement in a current controlled path, such as a path including an inductive element. The invention preferably provides a bypass path which is a further switched arrangement, and which is also a current-controlled path. The current controlled path on the bypass path preferably includes an inductive element.

A switching stage incorporating such a bypass structure preferably includes two layers of control.

In a first layer of control, the current through the bypass path is switched by the current exceeding a threshold. The current through the bypass path flows continuously. In a preferred arrangement the bypass path includes a switch connected between a voltage source and a first terminal of an inductor. The second terminal of the inductor is connected to an output of the switching stage. The switch is switchable between two states: in a first state the switch connects the voltage source to the first terminal of the inductor; and in a second state the switch connects electrical ground to the first terminal of the inductor. Thus with the switch in the first state the current in the bypass path increases, and with the switch in the second state the current in the bypass path decreases.

In this first layer of control, the control of the switch in the bypass path is arranged such that with the switch in the first state and the first terminal of the inductor connected to the voltage supply, when the current in the bypass path exceeds a first predetermined value the switch is switched to the second state and the first terminal of the inductor is connected to electrical ground. The current in the bypass path then falls, and when this current falls below a second predetermined value (the second predetermined value being lower than the first predetermined value), the switch is again turned to the first state and the first terminal of the inductor connected to the voltage source. This cycle of the first control loop is repeated continuously, to control the current flowing in the bypass path.

A further modification of this first layer of control can be applied where if the current falls below the second (lower) predetermined level and the switch is already in the first state. In this case, a further switch connects the first terminal of the inductor to a higher voltage level. In this case, the first terminal of the inductor remains connected to the higher voltage level until the current rises up to the first (higher) predetermined level. If however the current reaches the first (upper) threshold and the inductor is connected to the voltage source, the inductor is switched to ground as with the unmodified structure.

With this additional control, the action taken as the current threshold is reached depends upon the previous state of the switches.

If the first (upper) predetermined level is reached, then if the switch already connects the first terminal of the inductor to the voltage source, then the first terminal of the inductor is connected to electrical ground. If the switch already connects the first terminal of the inductor to the higher voltage supply, then the first terminal of the inductor is connected to the voltage supply.

If the second (lower) predetermined level is reached, then if the first terminal of the inductor is connected to ground, the first terminal of the inductor is reconnected to the voltage source. If the first terminal of the inductor is already connected to the voltage source, then the first terminal of the inductor is connected to the higher voltage supply.

Although in FIG. 5 it is shown that the additional switch 66 is connected to the supply line 40, in practice the additional switch may be selectively connected to any one of the supply lines 35 to 40 in a further modified arrangement. If the lower level is reached, then the first terminal of the inductor is connected to the next supply above. If the upper level is reached then the first terminal of the inductor is connected to the next supply below. If there are no further voltages below, the first terminal of the inductor is connected to electrical ground.

This optional modified control affects the first control loop only

This first control loop forms a fast control loop around the bypass path, and this control loop does not directly involve the main path.

In a second layer of control, a slower control loop is provided which controls the first and second predetermined values of the first control loop, by varying them. These predetermined values are varied in dependence on the current in the main path. Preferably, in an arrangement as shown in FIG. 5, the predetermined values are varied in dependence on current flowing in the supply modulator switch. This second control loop moves both the upper and lower predetermined values together. The distance between the upper and lower predetermined levels is determined purely by how tight the control of the current in the bypass path is to be controlled. This is totally independent of the main path. Because the control effects both the upper and lower levels simultaneously, then alternatively it can be considered as a single level, having an error above and an error below, the values above and below the signal level being equal.

The provision of a two layer control is to provide tight control of the current flowing in the bypass path, but simultaneously ensuring that it is slowly responsive to the average current of the first path. This isolates the bypass path from the rapidly changing current in the main path, particularly the rapidly changing current due to the modulator.

Alternative control techniques can be provided. For example, the current in the bypass path may be controlled using clocked PWM (pulse width modulation) techniques.

The above-described control technique can be further understood with further reference to FIGS. 7 and 8. The current sensor 106 provides a value of the instantaneous current in the main current path (in the preferred embodiment, in the modulator path). The reference current generator 110 provides a 'target' current value, which in the preferred embodiment is the desired long-term average current for the main path. This value may be chosen at the design stage, taking into account the desired operation and the design of the components (preferably of a reduced size) in the main path.

The subtractor 108 provides an error value, representing the instantaneous error of the current in the main path in comparison to the target long-term average current. This is integrated in integrator 112 to average the error value, and provide the averaged error over time, $I_{trip}$.

The average error, $I_{trip}$, is then used by the controller to set the first predetermined value for the control of the switch stage 64, being the lower of the two threshold levels. The upper predetermined level is set as a fixed offset from the lower level. As the average error varies, and the lower level set by $I_{trip}$ varies, then the upper level also varies to maintain a fixed distance between the upper and lower levels.

Thus, in FIGS. 7 and 8, the target value for the main path is the output current from the reference current generator 110, the first (lower) threshold is $I_{trip}$, and the second higher threshold is $I_{trip}+I_{hyst}$.

An alternative way of looking at this would be to set a threshold at $I_{trip}$, and then set the first and second predetermined levels above and below this at fixed offsets, e.g. $(I_{trip}+½ I_{hyst})$, and $(I_{trip}-½ I_{hyst})$.

The invention has been described herein by way of reference to particular examples and embodiments, for the purposes of illustrating the invention and its embodiments. The invention is not limited to the specifics of any embodiment descried herein. Any feature of any embodiment may be implemented in combination with features of other embodiments, no embodiment being exclusive. The scope of the invention is defined by the appended claims.

What is claimed is:

1. A switching stage comprising:
   a first switching path having at least one switching element for selectively connecting an input of the switching stage to an output of the switching stage; and
   a second switching path having at least one switching element for selectively connecting the input of the switching stage to the output of the switching stage,
   wherein the first and second switching paths are controlled such that a signal is selectively routed from the input of the switching stage to the output of the switching stage via the first and second switching paths in dependence on the current of the signal to be routed,
   wherein the at least one switching element of the second switching path is selectively connected to route the signal from the input to the output such that with the at least one switching element of the second switching path in a first state, the current in the second path rises until a first current threshold level is reached, responsive to which condition the at least one switching element of the second switching path is switched to a second state, and
   wherein in the second state the current in the second path falls until a second current threshold level is reached, responsive to which condition the at least one switching element of the second switching path is switched to the first state, wherein there is provided a further switching element in the second switching path arranged to selectively connect a first terminal of a first inductor to a higher voltage level, wherein the connection to the higher voltage level is enabled responsive to the current in the second switching path falling to the second threshold level when the at least one switching element of the second switching path is in the first state.

2. The switching stage of claim 1 wherein the at least one switching element of the first switching path is configured to handle a smaller current than the at least one switching element of the second switching path, and wherein the size of the at least one switching element of the first switching path is smaller than the size of the at least one switching element of the second switching path.

3. The switching stage of claim 1, wherein the at least one switching element of the second switching path is selectively connected to route the signal from the input to the output such that the current in the second path is maintained within a predetermined range.

4. The switching stage of claim 1 wherein the higher voltage level is provided by a signal line of the first switching path.

5. The switching stage of claim 1, wherein the further switching element connects the first terminal of the first inductor to the higher voltage level until the current in the second switching path rises to the first threshold level.

6. The switching stage of claim 1, wherein the further switching element is arranged to switch the first terminal of the first inductor to successively higher voltages if the current falls to the first threshold level whilst connected to a given voltage level.

7. The switching stage of claim 1, wherein the further switching element is arranged to switch the first terminal of the first inductor to successively lower voltages if the current rises to the second threshold level whilst connected to a given voltage level.

8. The switching stage of claim 1, wherein:
   the at least one switching element of the second switching path comprises a first switch connected between a voltage source and a first terminal of the first inductor and a second switch connected between the first terminal of the first inductor and electrical ground,
   a second terminal of the first inductor is connected to the output of the switching stage,
   in the first state the first switch connects the first terminal of the first inductor to the voltage source, and
   in the second state the second switch connects the first terminal of the first inductor to electrical ground.

9. A switching stage comprising:
   a first switching path having at least one switching element for selectively connecting an input of the switching stage to an output of the switching stage; and
   a second switching path having at least one switching element for selectively connecting the input of the switching stage to the output of the switching stage,
   wherein the first and second switching paths are controlled such that a signal is selectively routed from the input of the switching stage to the output of the switching stage via the first and second switching paths in dependence on the current of the signal to be routed,
   wherein the at least one switching element of the second switching path is selectively connected to route the signal from the input to the output such that the current in the second path is maintained within a predetermined current range, and
   wherein the predetermined current range includes an upper and a lower limit determined in dependence on a target average value of the current in the first switching path, wherein the lower limit is determined in dependence on a difference between a sensed value of the current in the first switching path and the target average value of the current and wherein the upper limit is determined in dependence on a constant offset added to the lower limit.

10. The switching stage of claim 1, wherein the at least one switching element of the first switching path includes at least one switch array for connecting the input with one of a plurality of outputs.

11. The switching stage of claim 1, wherein the at least one switching element of the first switching path includes at least one switch array for connecting one of a plurality of inputs with the output.

12. The switching stage of claim 1, wherein the at least one switching element of the first switching path includes a first switch array for connecting an input of the first switch array to one of a plurality of intermediate signal lines, and a second switch array for connecting one of the plurality of intermediate signal lines to an output of the second switch array.

13. The switching stage of claim 12, further comprising a second inductor connected between a voltage source and the input of the first switch array, and a third inductor connected between the output of the second switch array and the output of the switching stage.

14. The switching stage of claim 13, further comprising a plurality of capacitors, each capacitor being connected between a respective intermediate signal line and electrical ground.

15. The switching stage of claim 14, further comprising a capacitor connected between the output of the switching stage and electrical ground, and the first inductor connected between the at least one switching element of the second switching path and the output of the switching stage.

16. A voltage converter including a switching stage according to claim 12, wherein the first switch array of the first switching path is controlled to generate a plurality of voltage supply levels on the intermediate signal lines, and the second switch array of the first switching path is controlled to select one of the generated voltage supply levels as a voltage supply.

17. The voltage converter of claim 16 wherein the second switch array is controlled to track the envelope of a reference signal, such that an output voltage is developed at the output of the switching stage which corresponds to a desired voltage level.

\* \* \* \* \*